US011790983B2

(12) United States Patent
Xu

(10) Patent No.: US 11,790,983 B2
(45) Date of Patent: Oct. 17, 2023

(54) OUTPUT DRIVE CIRCUIT AND MEMORY DEVICE

(71) Applicant: ChangXin Memory Technologies, Inc., Hefei (CN)

(72) Inventor: Yan Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 252 days.

(21) Appl. No.: 17/287,343

(22) PCT Filed: Jun. 10, 2020

(86) PCT No.: PCT/CN2020/095338
§ 371 (c)(1),
(2) Date: Apr. 21, 2021

(87) PCT Pub. No.: WO2021/073127
PCT Pub. Date: Apr. 22, 2021

(65) Prior Publication Data
US 2022/0310155 A1 Sep. 29, 2022

(30) Foreign Application Priority Data
Oct. 16, 2019 (CN) .......................... 201910981694.4

(51) Int. Cl.
*G11C 11/4096* (2006.01)
*G11C 11/4076* (2006.01)
*G11C 11/4093* (2006.01)

(52) U.S. Cl.
CPC ...... *G11C 11/4096* (2013.01); *G11C 11/4076* (2013.01); *G11C 11/4093* (2013.01)

(58) Field of Classification Search
CPC ............ G11C 11/4096; G11C 11/4076; G11C 11/4093; G11C 7/1057; G11C 7/1069;
(Continued)

(56) References Cited

U.S. PATENT DOCUMENTS 5,263,173 A * 11/1993 Gleason ............... G11C 7/1057
326/97
9,263,107 B1 * 2/2016 Wayland ............... G11C 7/109
(Continued)

FOREIGN PATENT DOCUMENTS

| CN | 101630697 A | 1/2010 |
| CN | 101939909 A | 1/2011 |

(Continued)

OTHER PUBLICATIONS

PCT/CN2020/095338 International Search Report dated Aug. 26, 2020 with English translation.

*Primary Examiner* — Ajay Ojha
(74) *Attorney, Agent, or Firm* — Alston & Bird LLP

(57) ABSTRACT

The present invention provides an output driving circuit and a memory device. The output driving circuit is provided with a pull-up pre-amplification unit and a pull-down pre-amplification unit between a signal input terminal and a signal output terminal, the pull-up pre-amplification unit and the pull-down pre-amplification unit adjust the duty cycle ratios of the positive input signal and the negative input signal so that the duty cycle ratios of the output signals at the signal output terminal is the same as that of the input signal at the signal input terminal, which avoids the mismatch of output impedance under different output voltages, thereby eliminating the problem of duty cycle ratio deviation of the output signal that affects the signal quality.

17 Claims, 8 Drawing Sheets

(58) Field of Classification Search
CPC .... G11C 29/022; G11C 29/028; G11C 29/023
See application file for complete search history.

(56) References Cited

U.S. PATENT DOCUMENTS

| | | |
|---|---|---|
| 2010/0066338 A1 | 3/2010 | Moussaoui |
| 2014/0071773 A1* | 3/2014 | Kushiyama .......... G11C 29/023 |
| | | 327/108 |
| 2014/0292390 A1* | 10/2014 | Baek ................. H03K 19/0005 |
| | | 327/160 |
| 2015/0008890 A1 | 1/2015 | Sasao et al. |

FOREIGN PATENT DOCUMENTS

| | | |
|---|---|---|
| CN | 103856187 A | 6/2014 |
| CN | 206686148 U | 11/2017 |
| CN | 210606642 U | 5/2020 |

\* cited by examiner

OUTPUT DRIVE CIRCUIT AND MEMORY DEVICE

CROSS REFERENCES TO RELATED APPLICATIONS

This application is a national phase entry of International Application No. PCT/CN2020/095338 filed on Jun. 10, 2020, which claims the benefit of priority to CN Patent Application CN 201910981694.4 filed on Oct. 16, 2019, both entitled "OUTPUT DRIVE CIRCUIT AND MEMORY DEVICE", the contents of which are incorporated herein by reference in its entirety.

TECHNICAL FIELD

The invention relates to the field of integrated circuits, in particular to an output drive circuit and a memory device.

BACKGROUND

In the applications of LPDDR4 (Low Power Double Data Rate SDRAM 4) and LPDDR4X, the high-speed interface standard of LVSTL (Low Voltage Swing Terminated Logic) is adopted. In the LPDDR4 JEDEC (Joint Electron Device Engineering Council) standard, the output signal amplitude can be set to VDDQ/3 or VDDQ/2. In the traditional design, the signal duty cycle ratio of the entire pre-amplifier stage is designed to be 50%, but because the output amplitude is VDDQ/3, the up and down impedance is asymmetrical, so the output signal duty cycle of the final output stage will deviate a lot from 50%, which will affect the quality of high-speed signal transmission and reduce the signal tolerance of the input receiving end. In addition, as the process temperature or voltage changes, the duty cycle of the output signal of the final output stage will also deviate.

Therefore, there is an urgent need for an output driving circuit that can avoid the deviation of the duty cycle of the output signal.

SUMMARY

The present invention provides an output drive circuit and a memory device, which can avoid the problems of output signal duty cycle deviation caused by output impedance mismatch under different output voltages, which affects signal quality.

According to one embodiment of the disclosure, an output drive circuit comprises a plurality of drive modules, wherein each of the plurality of drive module comprises: a pull-up pre-amplification unit, comprising: a first signal input terminal, wherein the first signal input terminal inputs a first control signal and a first input signal, wherein the first input signal has a preset duty cycle ratio and includes a positive data input signal; a first amplifier, wherein the first amplifier amplifies the positive data input signal to a first output signal, wherein the first output signal has a first duty cycle ratio, wherein the first duty cycle ratio is greater than the preset duty cycle ratio by a set value; and a first output terminal, wherein the first output terminal outputs the first output signal to a gate of a pull-up NMOS transistor; wherein the pull-up NMOS transistor has a drain connected to a power supply and a source connected to a first end of a pull-up resistor; and a pull-down pre-amplification unit, comprising: a second signal input terminal, wherein the second signal input terminal inputs a second control signal and a second input signal, wherein the second input signal has the preset duty cycle ratio and includes a negative data input signal; a second amplifier, wherein the second amplifier amplifies the negative data input signal to a second output signal, wherein the second output signal has a second duty cycle ratio, wherein the second duty cycle ratio is smaller than the preset duty cycle ratio by the set value; and a second output terminal, wherein the second output terminal outputs the second output signal to a gate of a pull-down NMOS transistor; wherein the pull-down NMOS transistor has a source connected to a ground and a drain connected to a second end of a pull-down resistor; and wherein a second end of the pull-up resistor and a first end of the pull-down resistor are connected to form a third output signal, wherein the third output signal has a third duty cycle ratio equal to the preset duty cycle ratio.

In some cases, the pull-up pre-amplification unit further comprises a first duty cycle ratio adjustment unit and a first duty cycle ratio control unit, wherein an input terminal of the first duty cycle ratio adjustment unit is connected to the positive data input signal, wherein an input terminal of the first duty cycle ratio control unit is connected to the first control signal, and wherein an output terminal of the first duty cycle ratio control unit is connected to the first duty cycle ratio adjustment unit to adjust the first duty cycle ratio of an output signal of the first duty cycle adjusting unit.

In some cases, the first duty cycle adjustment unit comprises an inverter group, wherein the inverter group comprises a first inverter and a second inverter connected in series, wherein the first inverter comprises a first PMOS transistor array composed of a plurality of parallel PMOS transistors and a first NMOS transistor array composed of a plurality of parallel NMOS transistors, and wherein the second inverter comprises a second PMOS transistor array composed of a plurality of parallel PMOS transistors and a second NMOS transistor array composed of a plurality of parallel NMOS transistors; wherein the first duty cycle ratio control unit outputs a first duty cycle ratio control signal to an input terminal of the first inverter; wherein the first inverter adjusts a number of the plurality of PMOS transistors in the first PMOS transistor array that are turned on and a number of the plurality of NMOS transistors in the first NMOS transistor array that are turned on according to the first duty cycle ratio control signal and the positive data input signal, and outputs a first inverter output signal; and wherein the second inverter receives the first inverter output signal so that the first duty cycle ratio of the first output signal is greater than the preset duty cycle ratio by the set value.

In some cases, the first duty cycle ratio control unit is capable of outputting a second duty cycle ratio control signal to an input terminal of the second inverter, wherein the second inverter adjusts the number of the plurality of PMOS transistors turned on in the second PMOS transistor array and the number of the plurality of NMOS transistors turned on in the second NMOS transistor array, according to the second duty cycle control signal and the first output signal of the first inverter, so that the first duty cycle ratio of the first output signal is greater than the preset duty cycle ratio by the set value.

In some cases, the first inverter decreases or increases the number of the plurality of PMOS transistors that are turned on in the first PMOS transistor array according to the first duty cycle ratio control signal and the first input signal and increases or decreases the number of the plurality of NMOS transistors that are turned on in the first NMOS transistor array, so that the first duty cycle ratio of the first output signal is greater than the preset duty cycle ratio by the set value.

In some cases, the input terminal of the first amplifier is connected to an output terminal of the first duty cycle adjusting unit, and an output terminal of the first amplifier is an output terminal of the pull-up pre-amplification unit.

In some cases, the pull-down pre-amplification unit comprises a second duty cycle ratio adjustment unit and a second duty cycle ratio control unit, wherein an input terminal of the second duty cycle ratio adjustment unit is connected to the negative data input signal, wherein an input terminal of the second duty cycle ratio control unit is connected to the second control signal, and wherein an output terminal of the second duty cycle ratio control unit is connected to the second duty cycle ratio adjustment unit to adjust the second duty cycle ratio of an output signal of the second duty cycle adjusting unit.

In some cases, the second duty cycle adjustment unit includes an inverter group, wherein the inverter group comprises a third inverter and a fourth inverter connected in series; L wherein the third inverter comprises a third PMOS transistor array composed of a plurality of parallel PMOS transistors and a third NMOS transistor array composed of a plurality of parallel NMOS transistors, wherein the fourth inverter comprises a fourth PMOS transistor array composed of a plurality of parallel PMOS transistors and a fourth NMOS transistor array composed of a plurality of parallel NMOS transistors; wherein the second duty cycle ratio control unit outputs a third duty cycle ratio control signal to an input terminal of the third inverter; wherein the third inverter adjusts a number of the plurality of PMOS transistors in the third PMOS transistor array to be turned on and the number of the plurality of NMOS transistors in the third NMOS transistor array to be turned on according to the third duty cycle control signal and the negative data input signal, and outputs a third inverter output signal; and wherein the fourth inverter receives the third inverter output signal, so that the second duty cycle ratio of the second output signal is smaller than the preset duty cycle ratio by the set value.

In some cases, the second duty cycle ratio control unit is capable of outputting a second duty cycle ratio control signal to an input terminal of the fourth inverter, and wherein the fourth inverter adjusts a number of the plurality of PMOS transistors turned on in the fourth PMOS transistor array and a number of the plurality of NMOS transistors turned on in the fourth NMOS transistor array according to the second duty cycle control signal and the third inverter output signal; so that the second duty cycle ratio of the second output signal is smaller than the preset duty cycle ratio by the set value.

In some cases, the third inverter increases or decreases the number of the plurality of PMOS transistors that are turned on in the third PMOS transistor array, and decreases or increases the number of the plurality of NMOS transistors that are turned on in the third NMOS transistor array, according to the third duty cycle control signal and the negative data input signal, so that the second duty cycle ratio of the second output signal is smaller than the preset duty cycle by the set value.

In some cases, the second amplifier is connected in series with the second duty cycle ratio adjusting unit.

In some cases, the plurality of drive modules are connected in parallel.

In some cases, the preset duty cycle ratio is 0.5, and an absolute value of the set value is greater than 0 and less than 0.4.

According to another embodiment of the disclosure, a memory device is provided, which comprises the output drive circuit as disclosed above.

The drive output circuit of the present invention is provided with a pull-up pre-amplification unit and a pull-down pre-amplification unit between the signal input terminal and the signal output terminal. The duty cycle ratio is adjusted so that the output signal at the signal output terminal is the same as that of the input signal at the signal input terminal, avoiding the deviation of the duty cycle of the output signal due to the output impedance mismatch under different output voltages, which affects the signal quality. It should be understood that the above general description and the following detailed description are only exemplary and cannot limit the present disclosure.

BRIEF DESCRIPTION OF THE DRAWINGS

By describing its exemplary embodiments in detail with reference to the accompanying drawings, the above and other objectives, features and advantages of the present disclosure will become more apparent.

DETAILED DESCRIPTION OF THE PREFERRED EMBODIMENTS

Figure 1:
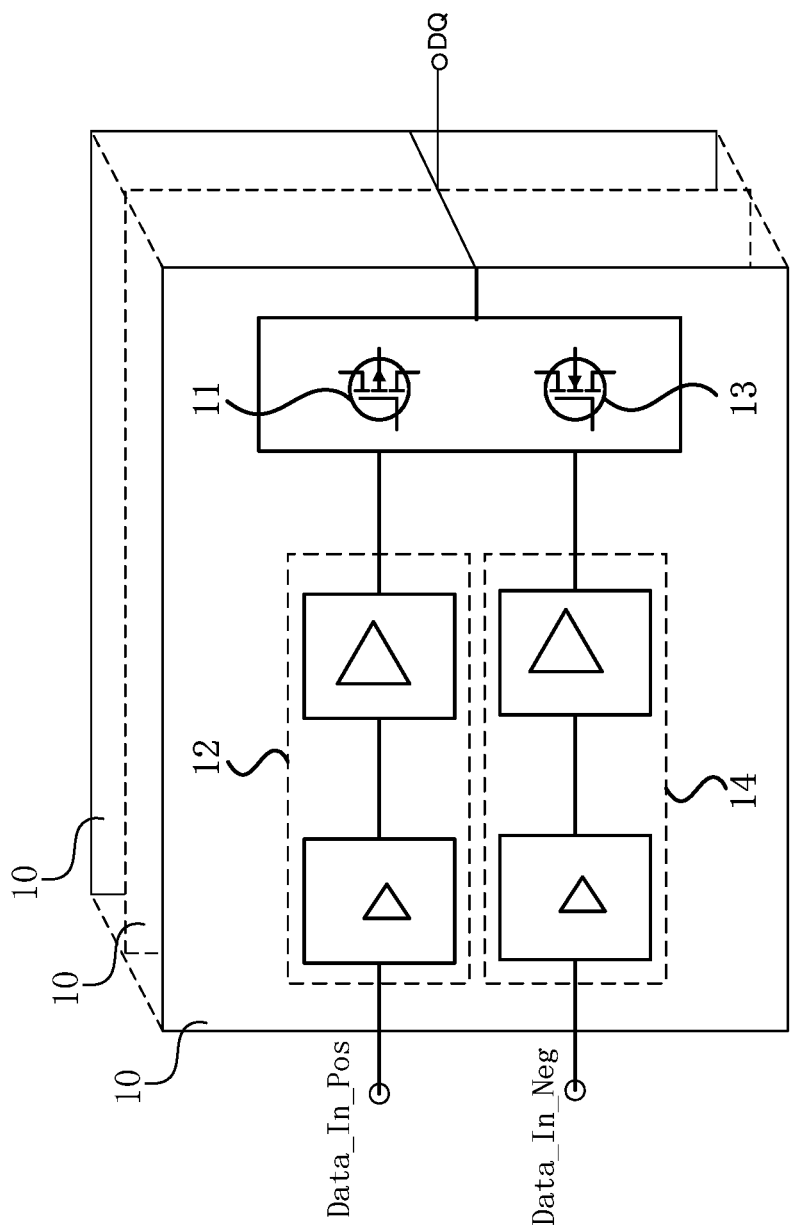
FIG. 1 is a schematic diagram of the drive output circuit structure according to the first embodiment of the present invention.

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

The present disclosure effectively overcomes various disadvantages in the related arts and hence has high industrial usage value. The foregoing embodiments only illustrate the principle and efficacy of the present disclosure exemplarily, and are not meant to limit variations of the technique. Any person skilled in the art can make modifications on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The drawings are only schematic illustrations of the present disclosure and are not necessarily drawn to scale. The same reference numerals in the figures denote the same or similar parts, and thus their repeated description will be omitted.

Furthermore, the described features, structures or characteristics can be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. can be used. In other cases, well-known structures, methods, devices, implementations, or operations are not shown or described in detail to avoid overwhelming attention and obscure all aspects of the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features.

The specific implementation manners of the output driving circuit and the memory provided by the present invention will be described in detail below in conjunction with the accompanying drawings.

FIG. 1 is a schematic diagram of the drive output circuit structure according to the first embodiment of the present invention.

Please refer to FIG. 1, the driving output circuit includes at least one driving module 10. In this embodiment, the drive output circuit includes a plurality of drive modules 10 connected in parallel, and the layout of the drive modules 10 is the same. The multiplexing of the driving module 10 in the driving output circuit can greatly simplify the design of the circuit and the realization of the layout, improve the matching among the driving modules, and reduce the parasitic effects between the circuits, especially the high-speed signal lines, thereby improving circuit performance under the high-speed operation.

Figure 2:
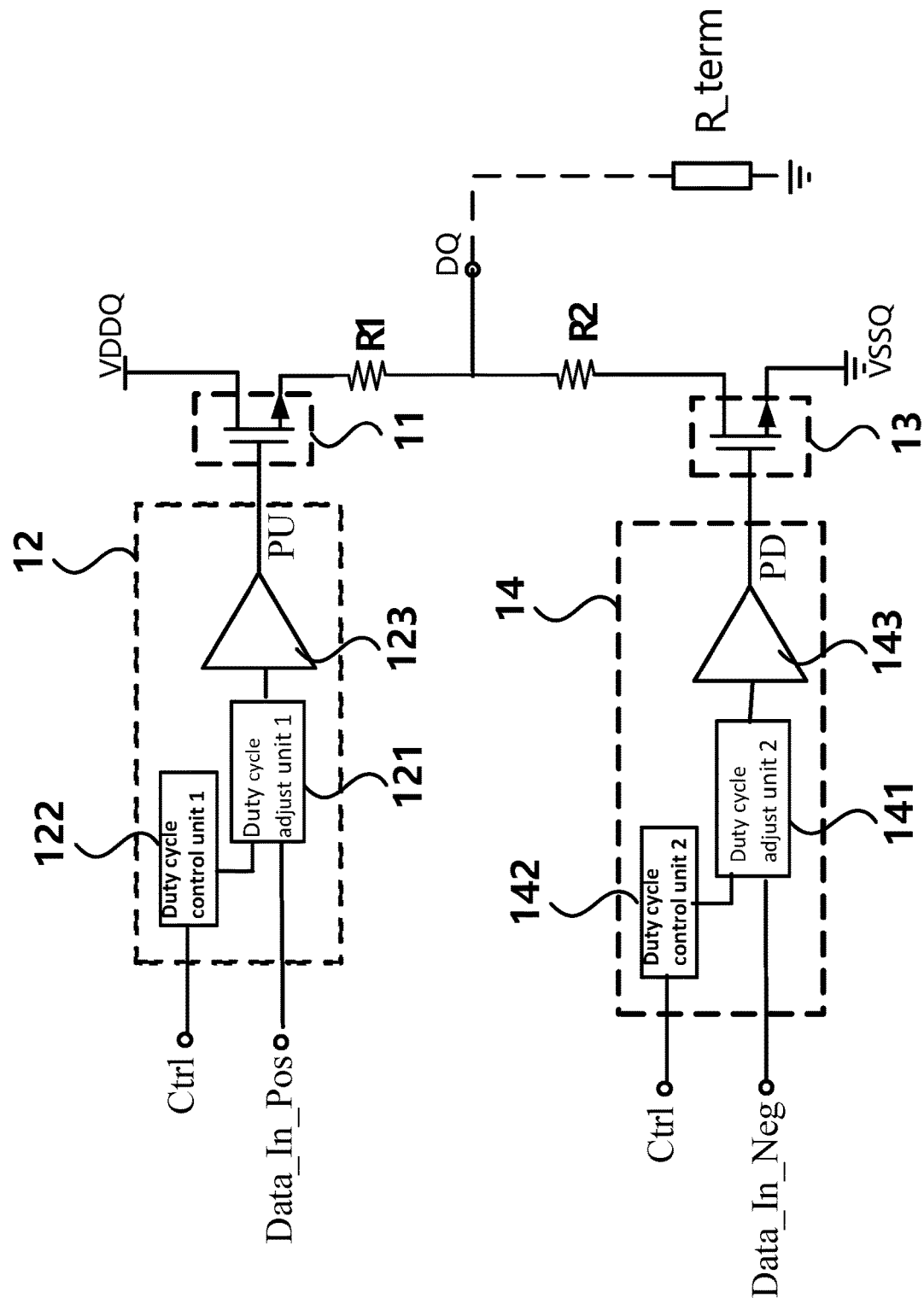
FIG. 2 is a circuit diagram of the first implementation of the driving module of the driving output circuit according to the embodiment of the present invention.

As described in the background and please refer to FIG. 2, the output signal amplitude in the LPDDR4 JEDEC standard can be set to VDDQ/3 or VDDQ/2. In a traditional design, the signal duty cycle ratio of the entire pre-amplifier stage is designed to be 50%. When the output amplitude of the signal output terminal DQ is VDDQ/2, the output signal duty cycle ratio of the output stage will not deviate, but when the output amplitude of the signal output terminal DQ is VDDQ/3, the effective impedance sum of the pull-up NMOS transistor 11 and resistor R1 does not match the impedance of the resistance R_term, which makes the output signal duty cycle ratio of the signal output terminal DQ deviate a lot from 50%, which affects the quality of high-speed signal transmission and reduces the signal tolerance of the input receiving terminal. In addition, as the process temperature and voltage change, the duty cycle ratio of the output signal of the final output stage will also deviate.

In order to solve the above problems, the present invention provides the following driving module for driving the output circuit.

FIG. 2 is a circuit diagram of the first implementation of the driving module of the driving output circuit according to the embodiment of the present invention. Please refer to FIG. 2, the driving module 10 includes a signal input terminal, a pull-up NMOS transistor 11, a pull-up resistor R1, a pull-up pre-amplification unit 12, a pull-down NMOS transistor 13, a pull-down resistor R2, a pull-down pre-amplification unit 14 and a signal output terminal DQ.

The signal input terminal inputs a control signal Ctrl and an input signal with a preset duty cycle ratio. The input signal includes complementary positive input signal Data_In_Pos and negative input signal Data_In_Neg. The input signal is a signal after parallel-to-serial conversion from the previous stage.

The pull-up NMOS transistor 11 has a source, a drain, and a gate. The drain of the pull-up NMOS transistor 11 is connected to the power supply voltage VDDQ, the source of the pull-up NMOS transistor 11 is connected to the first end of the pull-up resistor R1, and the gate of the pull-up NMOS transistor 11 is connected to the pull-up pre-amplification unit 12. The pull-up NMOS transistor 11 outputs an output signal DQ.

The first end of the pull-up resistor R1 is connected to the source of the pull-up NMOS transistor 11, and the second end is connected to the signal output terminal DQ.

The input terminal of the pull-up pre-amplification unit 12 is connected to the signal input terminal. Specifically, the input terminal of the pull-up pre-amplification unit 12 is connected to the positive input signal Data_In_Pos of the signal input terminal. The output terminal of the pull-up pre-amplification unit 12 is connected to the gate of the pull-up NMOS transistor 11. The pull-up pre-amplification unit 12 amplifies the positive input signal Data_In_Pos of the signal input terminal and changes the duty cycle ratio to output a first output signal PU. The first output signal PU is used as a driving signal for the pull-up NMOS transistor 11.

The first output signal PU has a first duty cycle ratio. The first duty cycle ratio is larger than the preset duty cycle ratio by a set value Δ, and the set value Δ may be a positive value or a negative value. If the set value Δ is a positive value, the first duty cycle ratio is greater than the preset duty cycle ratio; if the set value Δ is a negative value, the first duty cycle ratio is greater than the preset duty cycle ratio. Set the duty cycle ratio to be small. Herein, in a specific embodiment of the present invention, the preset duty cycle is 0.5, and the absolute value of the set value Δ is greater than 0 and less than 0.4.

Figure 3:
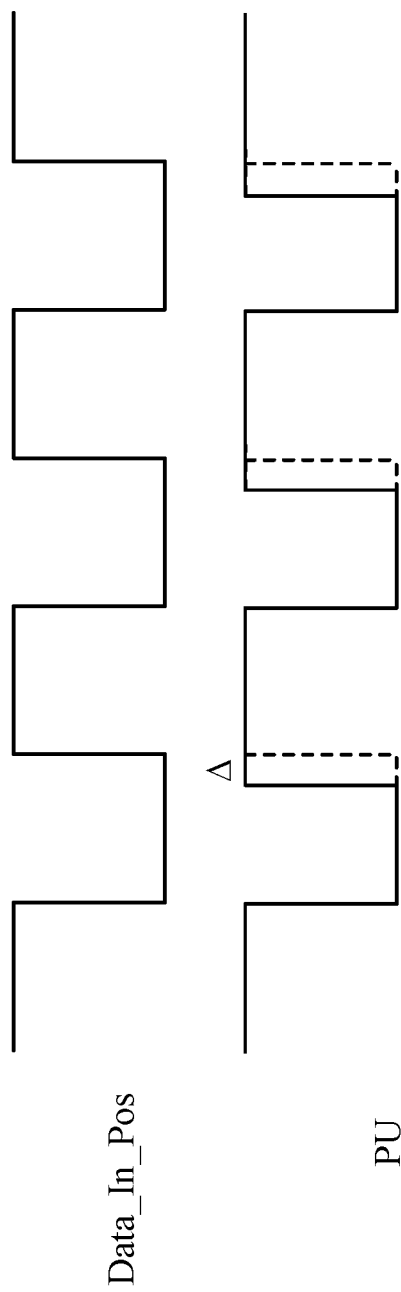
FIG. 3 is a timing diagram of the positive input signal Data_In_Pos at the signal input terminal and the first output signal PU of the pull-up pre-amplification unit.

In the first specific embodiment of the present invention, the set value Δ is a positive value, that is, the first duty cycle ratio is larger than the preset duty cycle. Please refer to FIG. 3, which is a timing diagram of the positive input signal Data_In_Pos at the signal input terminal and the first output signal PU of the pull-up pre-amplification unit 12. The timing diagram of the first output signal PU is schematically illustrated by a dotted line. The position of the positive input signal Data_In_Pos, after the pull-up pre-amplification unit 12, drives the first duty cycle ratio of the first output signal PU of the pull-up NMOS transistor 11, the preset duty cycle ratio of the positive input signal Data_In_Pos Increasing the set value Δ, that is, the on-time ratio of the pull-up NMOS transistor 11 increases by A, and the duty cycle ratio of the output signal DQ of the pull-up NMOS transistor 11 increases by the set value Δ.

Figure 4:
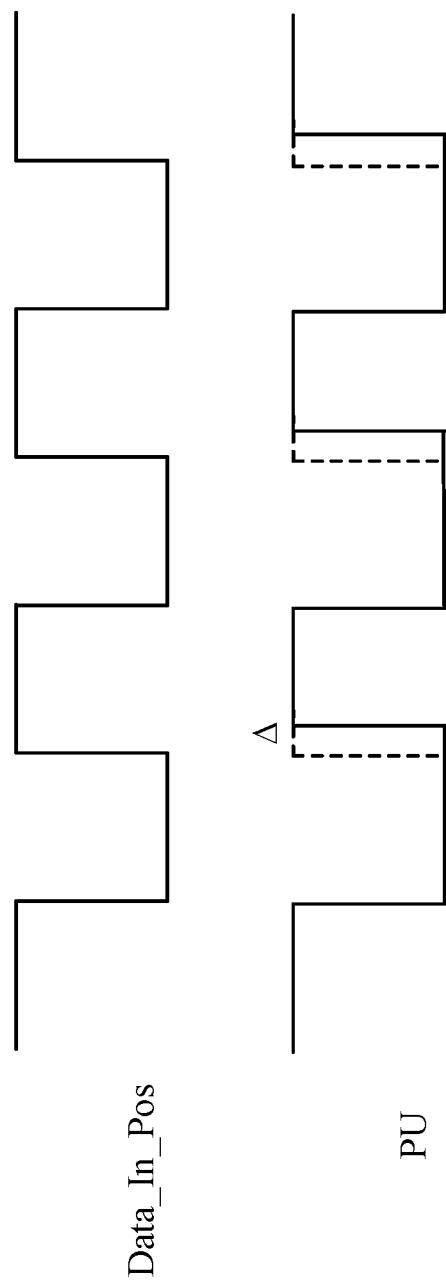
FIG. 4 is another timing diagram of the positive input signal Data_In_Pos at the signal input terminal and the first output signal PU at the pull-up pre-amplification unit.

In the second specific embodiment of the present invention, the set value Δ is a negative value, that is, the first duty cycle is smaller than the preset duty cycle. Please refer to FIG. 4, which is another timing diagram of the positive input signal Data_In_Pos at the signal input terminal and the first output signal PU at the pull-up pre-amplification unit 12. After the pull-up pre-amplification unit 12, the first duty cycle ratio of the first output signal PU of the transistor 11 is smaller than the preset duty cycle ratio of the positive input signal Data_In_Pos by the set value Δ, that is, the on-time duty cycle ratio of the pull-up NMOS transistor 11 is reduced if A is exceeded, the duty cycle ratio of the output signal DQ of the pull-up NMOS transistor 11 is reduced by the set value Δ.

Please continue to refer to FIG. 2, the pull-up pre-amplification unit 12 includes at least the first duty cycle adjustment unit 121 and at least one first duty cycle ratio control unit 122. The input terminal of the first duty cycle ratio adjustment unit 121 is connected to the positive input signal Data_In_Pos, the input terminal of the first duty cycle ratio control unit 122 is connected to the control signal Ctrl, and the output terminal of the first duty cycle ratio control unit 122 is connected to the input terminal of the first duty cycle ratio adjustment unit 121.

The first duty cycle ratio control unit 122 is combined with the positive input signal Data_In_Pos to adjust the duty cycle ratio of the output signal of the first duty cycle ratio adjustment unit 121. In this specific embodiment, the pull-up pre-amplification unit 12 includes a first duty cycle ratio adjustment unit 121 and a first duty cycle ratio control unit 122.

Further, in the first specific embodiment, the pull-up pre-amplification unit 12 further includes at least one first amplifier 123, the input terminal of the first amplifier 123 is connected to the output terminal of the first duty cycle adjusting unit 121, and the output terminal of the first amplifier 123 is the output terminal of the pull-up pre-amplification unit 12. That is, after the positive input signal Data_In_Pos is passed through the first duty cycle ratio adjusting unit 121 and the amplifier 123, the duty cycle ratio of the positive input signal Data_In_Pos is adjusted and the signal is amplified to form the first output signal PU with the first duty cycle ratio.

Figure 5:
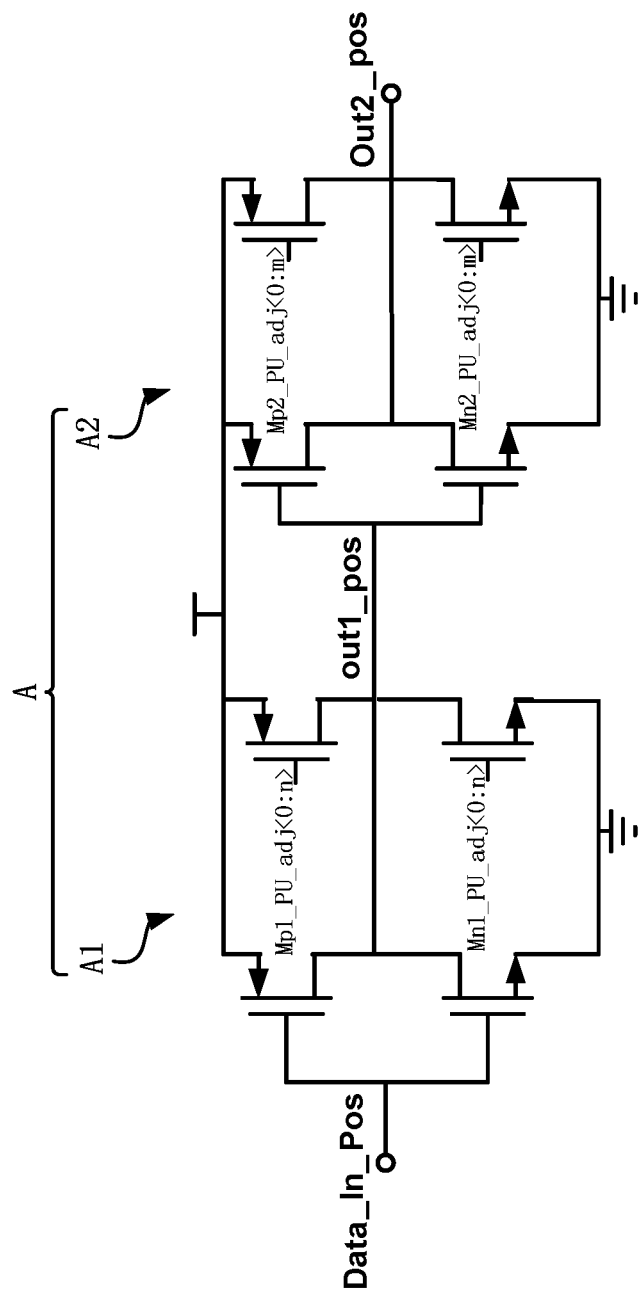
FIG. 5 is a circuit diagram of the first duty cycle ratio adjusting unit.

The following is an example to illustrate an implementation of the first duty cycle adjusting unit. FIG. 5 is a circuit diagram of the first duty cycle ratio adjusting unit 122. Please refer to FIG. 5, the first duty cycle ratio adjustment unit 121 includes at least one inverter group A. The inverter group A includes a first inverter A1 and a second inverter A2 connected in series. The first inverter A1 includes a first PMOS transistor array composed of a plurality of parallel PMOS transistors Mp1_PU_adj<0:n> and a first NMOS transistor array composed of a plurality of parallel NMOS transistors Mn1_PU_adj<0:n>; The second inverter A2 includes a second PMOS transistor array composed of a plurality of parallel PMOS transistors Mp2_PU_adj<0:m> and a second NMOS transistor array composed of a plurality of parallel NMOS transistors Mn2_PU_adj<0:m>. Here n represents the number of parallel PMOS transistors in the first PMOS transistor array and the number of parallel NMOS transistors in the first NMOS transistor array, and m represents the number of parallel PMOS transistors in the second PMOS transistor array and the number of PMOS transistors in the second NMOS transistor array and the number of NMOS transistors connected in parallel. In this embodiment, the first inverter A1 and the second inverter A2 are connected in series, so that the input signal is output in the same phase after passing through the inverter group A.

The first duty cycle ratio control unit 122 outputs the first duty cycle ratio control signals Mp1_PU<0:n> and Mn1_PU<0:n> to the gate of the first PMOS transistor array composed of Mp1_PU_adj<0:n> and Mn1_PU_adj, respectively. The gate of the first NMOS transistor array composed of <0:n>; the first inverter A1 adjusts the first inverter A1 according to the first duty cycle control signal Mp1_PU<0:n> and Mn1_PU<0:n>. The number of PMOS transistors in the first PMOS transistor array is turned on and the number of NMOS transistors in the first NMOS transistor array are turned on, and a first inverter output signal out1_pos is output, and the second inverter A2 receives the first inverter outputs the signal out1_pos and outputs a second inverter output signal out2_pos. The duty cycle ratio of the second inverter output signal out2_pos will increase or decrease compared to the preset duty cycle ratio of the positive input signal Data_In_Pos either is larger or smaller. That is, the first duty cycle ratio control unit 122 adjusts the number of transistors that are turned on by the first PMOS transistor array and the first NMOS transistor array, that is, the number of the first PMOS transistor array and the first NMOS transistor array size, thereby controlling the duty cycle ratio of the second inverter output signal out2_pos.

In this specific embodiment, the first duty cycle adjustment unit 121 includes an inverter group A. The inverter group A includes a first inverter A1 and a second inverter A2 connected in series, and the duty cycle ratio of the second inverter output signal out2_pos outputted by the second inverter A2, the preset duty cycle ratio of the positive input signal Data_In_Pos increases by the set value Δ, thereby causing the first duty cycle ratio of the first output signal PU to increase the preset duty cycle ratio by the set value Δ. In turn, the duty cycle ratio of the signal output terminal DQ is 50%. In other specific embodiments of the present invention, the duty cycle ratio adjustment unit 121 includes a plurality of inverter groups A, and the duty cycle ratio of the output signal output by the last inverter A is greater than that of the positive input signal Data_In_Pos. The preset duty cycle is reduced by the set value Δ, that is, the duty cycle is adjusted by a plurality of inverter groups A to reduce the duty cycle ratio of the output signal PU by the set value Δ, so that the signal output terminal DQ duty cycle is 50%.

Specifically, in the embodiment, the set value Δ is a positive value, and the first duty cycle ratio control signals Mp1_PU<0:n> and Mn1_PU<0 output by the first duty cycle ratio control unit 122:n> combined with the positive input signal Data_In_Pos to form a total control signal input to the first inverter A1. The first inverter A1 reduces the number of conductive PMOS transistors in the first PMOS transistor array and increases the number of conductive NMOS transistors in the first NMOS transistor array according to the total control signal, the low-level duty cycle ratio in the first inverter output signal out1_pos is greater than the high-level duty cycle ratio. After the second inverter A1 is driven by the first inverter output signal out1_pos, in the second inverter output signal out2_pos, the low-level duty cycle ratio is smaller than the high-level duty cycle ratio, and the second inverter output signal duty cycle ratio of out2_pos is larger than the preset duty cycle ratio of the positive input signal Data_In_Pos by the set value |Δ|. The second inverter output signal out2_pos is passed through the first amplifier 123 to form a first output signal PU having a first duty cycle ratio, and the first duty cycle ratio of the first output signal PU is increased by a setting value |Δ| in the preset duty cycle ratio, the first output signal PU drives the pull-up NMOS transistor 11, so that the turned-on-time of the pull-up NMOS transistor 11 is increased, and thus the duty cycle ratio of the DQ becomes 50%.

In the second specific embodiment of the present invention, the set value Δ is a negative value, and the first duty cycle ratio control signals Mp1_PU<0:n> and Mn1_PU<0:n output by the duty cycle ratio control unit 122> Combined with the positive input signal Data_In_Pos to form a total control signal input to the first inverter A1. The first inverter A1 increases the number of conductive PMOS transistors in the first PMOS transistor array and reduces the number of conductive NMOS transistors in the first NMOS transistor array according to the total control signal, the low-level duty cycle ratio in the first inverter output signal out1_pos is smaller than the high-level duty cycle ratio. After the second inverter A1 is driven by the first inverter output signal out1_pos, the high level accounted for in the second inverter output signal out2_pos is smaller than the low level accounted for, and the second inverter output signal out2_pos The duty cycle ratio of the positive input signal Data_In_Pos is reduced by the preset duty cycle by the set value |Δ|. The second inverter output signal out2_pos is passed through the first amplifier 123 to form a first output signal PU having a first duty cycle ratio, and the first duty cycle ratio of the first output signal PU is reduced by a preset duty cycle ratio With the setting value |Δ|, the first output signal PU drives the pull-up NMOS transistor 11, so that the on-time of the pull-up NMOS transistor 11 is reduced.

Further, in the first specific embodiment, the first duty cycle ratio control unit 122 can also output a second duty cycle ratio control signal Mp2_PU<0:n>, and the gate of the second PMOS transistor array is composed of from Mn2_PU<0:n> to Mp2_PU_adj<0:n> respectively, and the gate of the second NMOS transistor array is composed of Mn2_PU_adj<0:n>, the second inverter A2 adjusts the number of PMOS transistors in the second PMOS transistor array that are turned on and the number of NMOS transistors in the second NMOS transistor array that are turned on, according to the second PMOS duty cycle ratio control signal Mp2_PU<0:n> and Mn2_PU<0:n> and the first inverter output signal out1_pos, so that the first duty cycle ratio of the first output signal is larger than the preset duty cycle by the set value Δ. That is to say, after the positive input signal Data_In_Pos passes through the first inverter A1, the duty cycle ratio of the first inverter output signal out1_pos is not adjusted to the required value, and the first inverter can pass through the first inverter A1. The output signal out1_pos and the second duty cycle control signals Mp2_PU<0:n> and Mn2_PU<0:n> form a total control signal to adjust the number of PMOS transistors in the second PMOS transistor array and the second number of NMOS transistors in the NMOS transistor array that are turned on is such that the first duty cycle ratio of the first output signal is increased or decreased by the set value Δ compared to the preset duty cycle.

The foregoing is a specific embodiment of the pull-up pre-amplification unit. In other specific embodiments of the present invention, other methods may also be used to realize the function of the pull-up pre-amplification unit.

The pull-down NMOS transistor 13 has a source, a drain, and a gate. The source of the pull-down NMOS transistor 13 is connected to the ground terminal VSSQ, and the drain of the pull-down NMOS transistor 13 is connected to the second end of the pull-down resistor R2. The gate of the pull-down NMOS transistor 13 is connected to the pull-down preamplifier unit 14, and the pull-down NMOS transistor 13 outputs an output signal DQ.

The first end of the pull-down resistor R2 is connected to the signal output terminal DQ, and the second end is connected to the drain of the pull-down NMOS transistor 13.

The input terminal of the pull-down pre-amplification unit 14 is connected to the signal input terminal. Specifically, the input terminal of the pull-down preamplifier unit 14 is connected to the negative input signal Data_In_Neg of the signal input terminal. The output terminal of the pull-down pre-amplification unit 14 is connected to the gate of the pull-down PMOS transistor 13. The pull-down pre-amplification unit 14 amplifies the negative input signal Data_In_Neg of the signal input terminal and changes the duty cycle to output a second output signal PD. The second output signal PD is used as a driving signal for the pull-down PMOS transistor 13.

The second output signal PD has a second duty cycle, and the second duty cycle is smaller than the preset duty cycle by the set value Δ. In other words, the second output signal PD and the first output signal PU have the same amount of change in the duty cycle, and the direction of change is opposite. Specifically, if the preset duty cycle ratio of the first duty cycle ratio of the first output signal PU increases |Δ|, the preset duty cycle ratio of the second duty cycle ratio of the second output signal PD decreases |Δ|; if the first duty cycle ratio of the first output signal PU is reduced by the preset duty cycle ratio |Δ|, the second duty cycle ratio of the second output signal PD is increased by the preset duty cycle ratio |Δ|.

Figure 6:
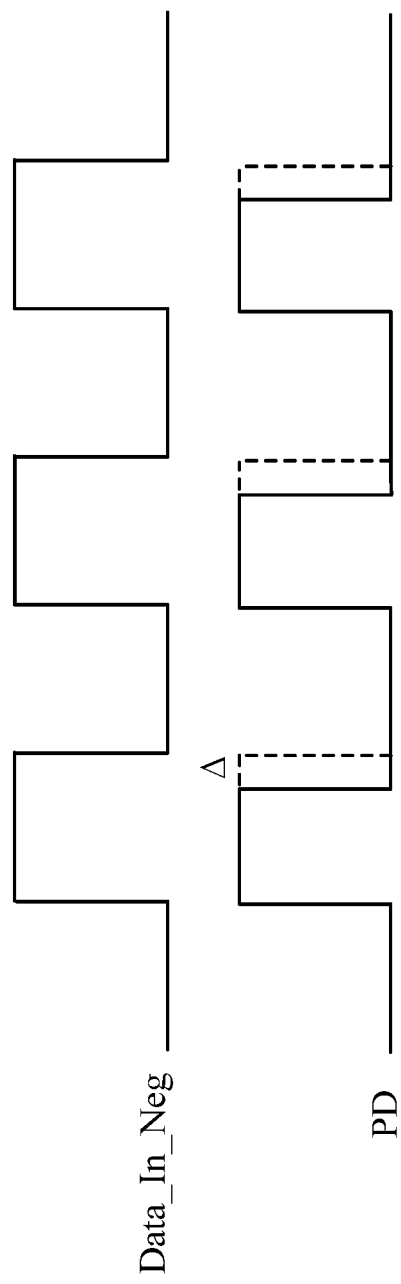
FIG. 6 is a timing diagram of the negative input signal Data_In_Neg at the signal input terminal and the second output signal PD at the pull-down pre-amplification unit.
Figure 7:
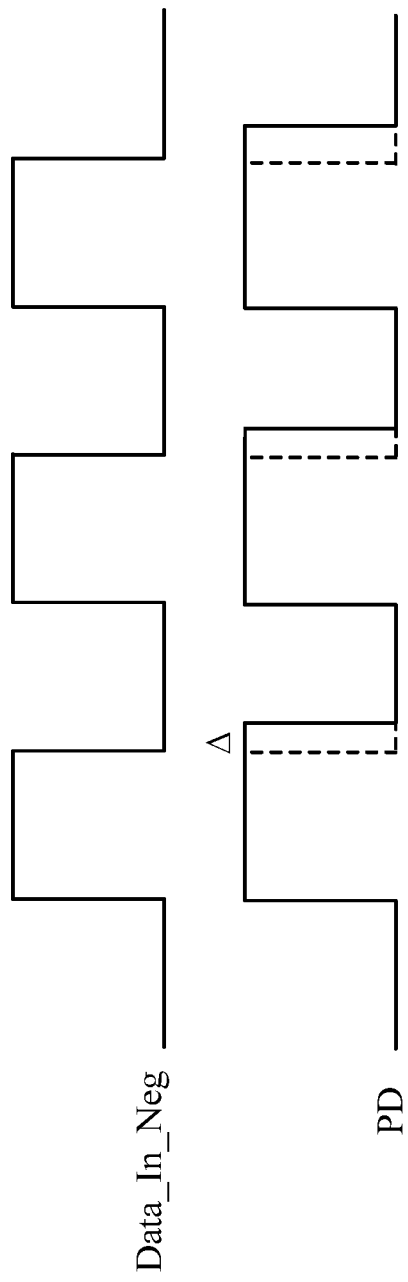
FIG. 7 is another timing diagram of the negative input signal Data_In_Neg at the signal input terminal and the second output signal PD at the pull-down pre-amplification unit.

In the first embodiment of the present invention, the set value Δ is a positive value, that is, the second duty cycle is reduced by a preset duty cycle. Please refer to FIG. 6, which is a timing diagram of the negative input signal Data_In_Neg at the signal input terminal and the second output signal PD at the pull-down pre-amplification unit 14. After the pull-down pre-amplification unit 14, the pull-down PMOS is driven The second duty cycle ratio of the second output signal PD of the transistor 13 is reduced by the preset duty cycle ratio of the negative input signal Data_In_Neg by the set value Δ, that is, the turned-on-time ratio of the pull-down NMOS transistor 13 is reduced by Δ. In the second specific embodiment of the present invention, the set value Δ is a negative value, that is, the second duty cycle is larger than the preset duty cycle. Please refer to FIG. 7, which is another timing diagram of the negative input signal Data_In_Neg at the signal input terminal and the second output signal PD at the pull-down pre-amplification unit 14. After the pull-down pre-amplification unit 14, the pull-down NMOS is driven so the second duty cycle ratio of the second output signal PD of the transistor 13 is larger than the preset duty cycle ratio of the negative input signal Data_In_Neg by a set value |Δ|, that is, the turned-on-time ratio of the pull-down NMOS transistor 13 is increased |Δ|.

Please continue to refer to FIG. 2, the pull-down pre-amplification unit 14 includes at least the second duty cycle ratio adjustment unit 141 and at least one duty cycle ratio control unit two 142, and the input terminal of the second duty cycle ratio adjustment unit 141 is connected to the negative input signal Data_In_Neg, the input end of the second duty cycle ratio control unit 142 is connected to the control signal Ctrl, and the output end of the second duty cycle ratio control unit 142 is connected to the input end of the second duty cycle ratio adjustment unit 141.

The second duty cycle ratio control unit 142 is combined with the negative input signal Data_In_Neg to adjust the duty cycle ratio of the output signal of the second duty cycle ratio adjustment unit 141. In this specific embodiment, the pull-down pre-amplification unit 14 includes a second duty cycle ratio adjustment unit 141 and a second duty cycle ratio control unit 142.

Further, in the first embodiment, the pull-down pre-amplification unit 14 further includes at least second amplifier 143, the input end of the second amplifier 143 is connected to the output end of the second duty cycle adjustment unit 141, and the output terminal of the second amplifier 143 is the output terminal of the pull-down pre-amplification unit 14. In other words, after the negative input signal Data_In_Neg is passed through the pull-down pre-amplification unit 14 and the second amplifier 143, its duty cycle is adjusted and the signal is amplified to form a second output signal PD with a second duty cycle ratio.

Figure 8:
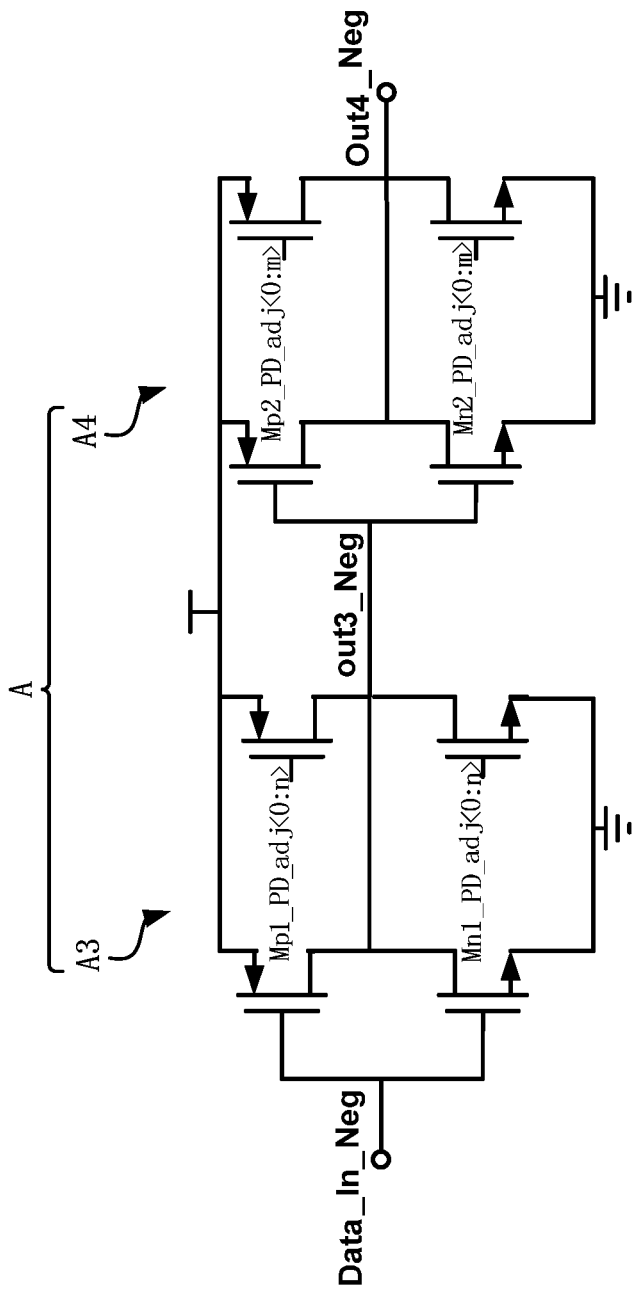
FIG. 8 is a circuit diagram of the second duty cycle ratio adjusting unit.

The following is an example to illustrate an implementation of the first duty cycle adjusting unit. FIG. 8 is a circuit diagram of the second duty cycle ratio adjusting unit. Please refer to FIG. 8, the second duty cycle adjusting unit 141 includes at least one inverter group A. The inverter group A includes a third inverter A3 and a fourth inverter A4 connected in series. The third inverter A3 includes a third PMOS transistor array composed of a plurality of parallel PMOS transistors Mp1_PD_adj<0:n> and a third NMOS transistor array composed of a plurality of parallel NMOS transistors Mn1_PD_adj<0:n>; the fourth inverter A4 includes a fourth PMOS transistor array composed of a plurality of parallel PMOS transistors Mp2_PD_adj<0:m>, and a fourth NMOS transistor array composed of a plurality of parallel NMOS transistors Mn2_PD_adj<0:m>. Here n represents the number of parallel PMOS transistors in the third PMOS transistor array and the number of parallel NMOS transistors in the third NMOS transistor array, m represents the number of parallel PMOS transistors in the fourth PMOS transistor array and the fourth NMOS transistor array, and the number of NMOS transistors connected in parallel. In this specific implementation, the third inverter A3 is connected in series with the fourth inverter A4, so that the input signal is output in the same phase after passing through the inverter group A.

The second duty cycle ratio control unit 142 outputs a third duty cycle ratio control signal Mp1_PD<0:n> and Mn1_PD<0:n> to the gates of the first PMOS transistor array composed of Mp1_PD_adj<0:n>, and the gates of the first NMOS transistor array composed of Mn1_PD_adj<0:n> respectively; the third inverter A3 adjusts separately the number of PMOS transistors in the third PMOS transistor array that are turned on and the number of NMOS transistors in the third NMOS transistor array that are turned on, according to the third duty cycle control signal Mp1_PD<0:n> and Mn1_PD<0:n>, and outputs a third inverter output signal out3_pos. The fourth inverter A4 receives the third inverter output signal out3_pos, and outputs a fourth inverter output signal out4_pos, the duty cycle ratio of the fourth inverter output signal out4_pos increases or decreases the preset duty cycle ratio of the negative input signal Data_In_Neg based if it is smaller or larger than it. That is, the second duty cycle ratio control unit 142 adjusts the number of transistors that are turned on by the third PMOS transistor array and the third NMOS transistor array, that is, the number of the third PMOS transistor array and the third NMOS transistor array or sizes, thereby controlling the duty cycle ratio of the fourth inverter output signal out4_neg.

In this implementation, the second duty cycle adjustment unit 141 includes an inverter group A. The inverter group A includes a third inverter A3 and a fourth inverter A4 connected in series, and the duty cycle ratio of the fourth inverter output signal out4_pos outputs by the fourth inverter A4 is as if the negative input signal Data_In_Neg is reduced by the preset duty cycle ratio of set value Δ, so that the second duty cycle ratio of the second output signal PD is reduced by the preset duty cycle ratio by the set value Δ, In turn, the duty cycle ratio of the signal output terminal DQ is 50%. In other embodiments of the present invention, the second duty cycle adjustment unit 141 includes a plurality of inverter groups A, and the duty cycle ratio of the output signal output by the last inverter A is lower than that of the negative input signal Data_In_Neg. The preset duty cycle is increased by the set value Δ, that is, the duty cycle ratio is adjusted by a plurality of inverter groups A to increase the duty cycle ratio of the output signal PU by the set value Δ, so that the signal output terminal DQ duty cycle is 50%.

Specifically, in this specific embodiment, the set value Δ is a positive value, and the third duty cycle ratio control signals Mp1_PD<0:n> and Mn1_PD<0:n> output by the duty cycle ratio control unit 142 is combined with the negative input signal Data_In_Neg to form a total control signal that is input to the third inverter A3. The third inverter A3 increases the number of conductive PMOS transistors in the third PMOS transistor array and reduces the number of conductive NMOS transistors in the first NMOS transistor array according to the total control signal, the high-level duty cycle ratio of the third inverter output signal out3_neg is greater than the low-level duty cycle ratio. After the fourth inverter A4 is driven by the third inverter output signal out3_neg, the low level accounted for in the fourth inverter output signal out4_neg is greater than the high level accounted for, the fourth inverter output signal duty cycle ratio of out4_neg is smaller than the preset duty cycle ratio of the negative input signal Data_In_Neg by the set value |Δ|. The fourth inverter output signal out4_neg is passed through the amplifier two 143 to form a second output signal PD with a second duty cycle ratio, and the second duty cycle ratio of the second output signal PD is reduced by a preset duty cycle ratio of the setting value |Δ|, the second output signal PD drives the pull-down NMOS transistor 13 so that the turned-on-time of the pull-down NMOS transistor 13 is reduced.

In the second specific embodiment of the present invention, the set value Δ is a negative value, and the third duty cycle ratio control signals Mp1_PD<0:n> and Mn1_PD<0:n output by the duty cycle ratio control unit 142> Combined with the negative input signal Data_In_Neg to form a total control signal that is input to the third inverter A3. The third inverter A3 reduces the number of conductive PMOS transistors in the third PMOS transistor array and increases the number of conductive NMOS transistors in the third NMOS transistor array according to the total control signal. The low-level duty cycle ratio of the three-inverter output signal out3_neg is greater than the high-level duty cycle ratio. After the fourth inverter A4 is driven by the third inverter output signal out3_neg, the high level proportion of the fourth inverter output signal out4_neg is greater than the low level proportion, and the fourth inverter output signal out4_neg duty cycle ratio of the negative input signal Data_In_Neg is larger than the preset duty cycle ratio of the set value |Δ|. The fourth inverter output signal out4_neg is passed through the amplifier two 143 to form a second output signal PD having a second duty cycle ratio, and the second duty cycle ratio of the second output signal PD is increased by a preset duty cycle ratio. When the set value |Δ| is large, the second output signal PD drives the pull-down NMOS transistor 13, so that the conduction time of the pull-down NMOS transistor 13 increases.

Further, in the first embodiment, the second duty cycle ratio control unit 142 can also output a fourth duty cycle ratio control signal Mp2_PD<0:n> and Mn2_PD<0:n> to the input terminal of the inverter A4. The fourth inverter A4 adjusts the output number of PMOS transistors in the fourth PMOS transistor array that are turned on and the number of NMOS transistors in the fourth NMOS transistor array that are turned on, according to the fourth duty cycle control signals Mp2_PD<0:n> and Mn2_PD<0:n> and the third inverter output signal out3_neg, so that the second duty cycle ratio of the second output signal is reduced by the set value Δ of the preset duty cycle. That is to say, after the negative input signal Data_In_Neg passes through the third inverter A3, the duty cycle ratio of the third inverter output signal out3_neg is not adjusted to the required value, and the third inverter can be passed through the third inverter A3. The output signal out3_neg and the fourth duty cycle control signals Mp2_PD<0:n> and Mn2_PD<0:n> form a total control signal to adjust the number of PMOS transistors in the fourth PMOS transistor array and the number of NMOS transistors in the fourth NMOS transistor array that are turned on so that the second duty cycle ratio of the second output signal is smaller than the preset duty cycle by the set value Δ.

The foregoing is a specific implementation of the pull-down pre-amplification unit. In implementations of the present invention, other methods may also be used to implement the function of the pull-down pre-amplification unit.

The signal output terminal DQ is connected to the second terminal of the pull-up resistor R1 and the first terminal of the pull-down resistor R2, and the duty cycle ratio of the signal output terminal DQ is equal to the preset duty cycle ratio. In a specific embodiment the number is 0.5.

As the process temperature or voltage of the output drive circuit changes, the duty cycle ratio of the signal will shift during the transmission of the input signal, causing the duty cycle ratio of the output signal finally shown at the signal output terminal to deviate from the preset duty cycle. In the present invention, a pull-up pre-amplification unit 12 and a pull-down pre-amplification unit 14 are arranged between the signal input terminal and the signal output terminal, and the occupancy of the positive input signal and the negative input signal is adjusted through the pull-up pre-amplification unit 12 and the pull-down pre-amplification unit 14. The duty cycle ratio makes the DQ duty cycle ratio of the signal output terminal equal to the preset duty cycle ratio of the input signal, thereby avoiding the duty cycle ratio of the signal input terminal and the signal output terminal from changing.

The present invention also provides a memory device, which includes the above-mentioned output driving circuit. The memory device includes but is not limited to DRAM memory device.

The above are only the preferred embodiments of the present invention. It should be pointed out that for those of ordinary skill in the art, without departing from the principle of the present invention, several improvements and modifications can be made, and these improvements and modifications should also be considered as the protection scope of the present invention The exemplary embodiments of the present disclosure are specifically shown and described above. It should be understood that the present disclosure is not limited to the detailed structure, arrangement or implementation method described herein; on the contrary, the present disclosure intends to cover various modifications and equivalent arrangements included in the spirit and scope of the appended claims.

What is claimed is:

1. An output drive circuit, comprising a plurality of drive modules, wherein each of the plurality of drive module comprises:
   a pull-up pre-amplification unit, comprising:
      a first signal input terminal, wherein the first signal input terminal inputs a first control signal and a first input signal, wherein the first input signal has a preset duty cycle ratio and includes a positive data input signal;
      a first amplifier, wherein the first amplifier amplifies the positive data input signal to a first output signal, wherein the first output signal has a first duty cycle ratio, wherein the first duty cycle ratio is greater than the preset duty cycle ratio by a set value; and
      a first output terminal, wherein the first output terminal outputs the first output signal to a gate of a pull-up NMOS transistor;
      wherein the pull-up NMOS transistor has a drain connected to a power supply and a source connected to a first end of a pull-up resistor; and
   a pull-down pre-amplification unit, comprising:
      a second signal input terminal, wherein the second signal input terminal inputs a second control signal and a second input signal, wherein the second input signal has the preset duty cycle ratio and includes a negative data input signal;
      a second amplifier, wherein the second amplifier amplifies the negative data input signal to a second output signal, wherein the second output signal has a second duty cycle ratio, wherein the second duty cycle ratio is smaller than the preset duty cycle ratio by the set value; and
      a second output terminal, wherein the second output terminal outputs the second output signal to a gate of a pull-down NMOS transistor;
   wherein the pull-down NMOS transistor has a source connected to a ground and a drain connected to a second end of a pull-down resistor;
   wherein a second end of the pull-up resistor and a first end of the pull-down resistor are connected to form a third output signal, wherein the third output signal has a third duty cycle ratio equal to the preset duty cycle ratio;
   wherein the pull-up pre-amplification unit further comprises a first duty cycle ratio adjustment unit and a first duty cycle ratio control unit, wherein an input terminal of the first duty cycle ratio adjustment unit is connected to the positive data input signal, wherein an input terminal of the first duty cycle ratio control unit is connected to the first control signal, and wherein an output terminal of the first duty cycle ratio control unit is connected to the first duty cycle ratio adjustment unit to adjust the first duty cycle ratio of an output signal of the first duty cycle adjusting unit;
   wherein the first duty cycle adjustment unit comprises an inverter group, wherein the inverter group comprises a first inverter and a second inverter connected in series, wherein the first inverter comprises a first PMOS transistor array composed of a plurality of parallel PMOS transistors and a first NMOS transistor array composed of a plurality of parallel NMOS transistors, and wherein the second inverter comprises a second PMOS transistor array composed of a plurality of parallel PMOS transistors and a second NMOS transistor array composed of a plurality of parallel NMOS transistors;

wherein the first duty cycle ratio control unit outputs a first duty cycle ratio control signal to an input terminal of the first inverter;

wherein the first inverter adjusts a number of the plurality of PMOS transistors in the first PMOS transistor array that are turned on and a number of the plurality of NMOS transistors in the first NMOS transistor array that are turned on according to the first duty cycle ratio control signal and the positive data input signal, and outputs a first inverter output signal; and;

wherein the second inverter receives the first inverter output signal so that the first duty cycle ratio of the first output signal is greater than the preset duty cycle ratio by the set value first duty cycle adjusting unit.

2. The output driving circuit according to claim 1, wherein the first duty cycle ratio control unit is capable of outputting a second duty cycle ratio control signal to an input terminal of the second inverter, wherein the second inverter adjusts the number of the plurality of PMOS transistors turned on in the second PMOS transistor array and the number of the plurality of NMOS transistors turned on in the second NMOS transistor array, according to the second duty cycle control signal and the first output signal of the first inverter, so that the first duty cycle ratio of the first output signal is greater than the preset duty cycle ratio by the set value.

3. The output drive circuit according to claim 1, wherein the first inverter decreases or increases the number of the plurality of PMOS transistors that are turned on in the first PMOS transistor array according to the first duty cycle ratio control signal and the first input signal and increases or decreases the number of the plurality of NM OS transistors that are turned on in the first NMOS transistor array, so that the first duty cycle ratio of the first output signal is greater than the preset duty cycle ratio by the set value.

4. The output driving circuit according to claim 1, wherein the input terminal of the first amplifier is connected to an output terminal of the first duty cycle adjusting unit, and an output terminal of the first amplifier is an output terminal of the pull-up pre-amplification unit.

5. An output drive circuit, comprising a plurality of drive modules, wherein each of the plurality of drive module comprises:
a pull-up pre-amplification unit, comprising:
  a first signal input terminal, wherein the first signal input terminal inputs a first control signal and a first input signal, wherein the first input signal has a preset duty cycle ratio and includes a positive data input signal;
  a first amplifier, wherein the first amplifier amplifies the positive data input signal to a first output signal, wherein the first output signal has a first duty cycle ratio, wherein the first duty cycle ratio is greater than the preset duty cycle ratio by a set value; and
  a first output terminal, wherein the first output terminal outputs the first output signal to a gate of a pull-up NMOS transistor;

wherein the pull-up NMOS transistor has a drain connected to a power supply and a source connected to a first end of a pull-up resistor; and
a pull-down pre-amplification unit, comprising:
  a second signal input terminal, wherein the second signal input terminal inputs a second control signal and a second input signal, wherein the second input signal has the preset duty cycle ratio and includes a negative data input signal;
  a second amplifier, wherein the second amplifier amplifies the negative data input signal to a second output signal, wherein the second output signal has a second duty cycle ratio, wherein the second duty cycle ratio is smaller than the preset duty cycle ratio by the set value; and
  a second output terminal, wherein the second output terminal outputs the second output signal to a gate of a pull-down NMOS transistor;

wherein the pull-down NMOS transistor has a source connected to a ground and a drain connected to a second end of a pull-down resistor;

wherein a second end of the pull-up resistor and a first end of the pull-down resistor are connected to form a third output signal, wherein the third output signal has a third duty cycle ratio equal to the preset duty cycle ratio;

wherein the pull-down pre-amplification unit comprises a second duty cycle ratio adjustment unit and a second duty cycle ratio control unit, wherein an input terminal of the second duty cycle ratio adjustment unit is connected to the negative data input signal, wherein an input terminal of the second duty cycle ratio control unit is connected to the second control signal, and wherein an output terminal of the second duty cycle ratio control unit is connected to the second duty cycle ratio adjustment unit to adjust the second duty cycle ratio of an output signal of the second duty cycle adjusting unit;

wherein the second duty cycle adjustment unit includes an inverter group, wherein the inverter group comprises a third inverter and a fourth inverter connected in series; L wherein the third inverter comprises a third PMOS transistor array composed of a plurality of parallel PMOS transistors and a third NMOS transistor array composed of a plurality of parallel NMOS transistors, wherein the fourth inverter comprises a fourth PMOS transistor array composed of a plurality of parallel PMOS transistors and a fourth NMOS transistor array composed of a plurality of parallel NMOS transistors;

wherein the second duty cycle ratio control unit outputs a third duty cycle ratio control signal to an input terminal of the third inverter;

wherein the third inverter adjusts a number of the plurality of PMOS transistors in the third PMOS transistor array to be turned on and the number of the plurality of NMOS transistors in the third NMOS transistor array to be turned on according to the third duty cycle control signal and the negative data input signal, and outputs a third inverter output signal; and wherein the fourth inverter receives the third inverter output signal, so that the second duty cycle ratio of the second output signal is smaller than the preset duty cycle ratio by the set value.

6. The output driving circuit according to claim 5, wherein the second duty cycle ratio control unit is capable of outputting a second duty cycle ratio control signal to an input terminal of the fourth inverter, and wherein the fourth inverter adjusts a number of the plurality of PMOS transistors turned on in the fourth PMOS transistor array and a number of the plurality of NMOS transistors turned on in the fourth NMOS transistor array according to the second duty cycle control signal and the third inverter output signal; so that the second duty cycle ratio of the second output signal is smaller than the preset duty cycle ratio by the set value.

7. The output drive circuit according to claim 5, wherein the third inverter increases or decreases the number of the plurality of PMOS transistors that are turned on in the third PMOS transistor array, and decreases or increases the number of the plurality of NMOS transistors that are turned on in the third NMOS transistor array, according to the third duty cycle control signal and the negative data input signal, so that the second duty cycle ratio of the second output signal is smaller than the preset duty cycle by the set value.

8. The output driving circuit according to claim 5, wherein the second amplifier is connected in series with the second duty cycle ratio adjusting unit.

9. The output drive circuit according to claim 1, wherein the plurality of drive modules are connected in parallel.

10. The output drive circuit according to claim 1, wherein the preset duty cycle ratio is 0.5, and an absolute value of the set value is greater than 0 and less than 0.4.

11. A memory device, comprising the output drive circuit according to claim 1.

12. The memory device according to claim 11, wherein the pull-up pre-amplification unit in each of the plurality of drive modules of the output drive circuit comprises:
 a first duty cycle ratio adjustment unit and a first duty cycle ratio control unit, wherein an input terminal of the first duty cycle ratio adjustment unit is connected to the positive data input signal, wherein an input terminal of the first duty cycle ratio control unit is connected to the first control signal, and wherein an output terminal of the first duty cycle ratio control unit is connected to the first duty cycle ratio adjustment unit to adjust the first duty cycle ratio of an output signal of the first duty cycle adjusting unit.

13. The memory device according to claim 12, wherein the first duty cycle adjustment unit comprises an inverter group, wherein the inverter group comprises a first inverter and a second inverter connected in series, wherein the first inverter comprises a first PMOS transistor array composed of a plurality of parallel PMOS transistors and a first NMOS transistor array composed of a plurality of parallel NMOS transistors, and wherein the second inverter comprises a second PMOS transistor array composed of a plurality of parallel PMOS transistors and a second NMOS transistor array composed of a plurality of parallel NMOS transistors;
 wherein the first duty cycle ratio control unit outputs a first duty cycle ratio control signal to an input terminal of the first inverter;
 wherein the first inverter adjusts a number of the plurality of PMOS transistors in the first PMOS transistor array that are turned on and a number of the plurality of NMOS transistors in the first NMOS transistor array that are turned on according to the first duty cycle ratio control signal and the positive data input signal, and outputs a first inverter output signal; and
 wherein the second inverter receives the first inverter output signal so that the first duty cycle ratio of the first output signal is greater than the preset duty cycle ratio by the set value.

14. The memory device according to claim 13, wherein the first inverter decreases or increases the number of the plurality of PMOS transistors that are turned on in the first PMOS transistor array according to the first duty cycle ratio control signal and the first input signal and increases or decreases the number of the plurality of NMOS transistors that are turned on in the first NMOS transistor array, so that the first duty cycle ratio of the first output signal is greater than the preset duty cycle ratio by the set value.

15. The memory device according to claim 11, wherein the pull-down pre-amplification unit comprises a second duty cycle ratio adjustment unit and a second duty cycle ratio control unit, wherein an input terminal of the second duty cycle ratio adjustment unit is connected to the negative data input signal, wherein an input terminal of the second duty cycle ratio control unit is connected to the second control signal, and wherein an output terminal of the second duty cycle ratio control unit is connected to the second duty cycle ratio adjustment unit to adjust the second duty cycle ratio of an output signal of the second duty cycle adjusting unit.

16. The memory device according to claim 15, wherein the second duty cycle adjustment unit includes an inverter group, wherein the inverter group comprises a third inverter and a fourth inverter connected in series; L wherein the third inverter comprises a third PMOS transistor array composed of a plurality of parallel PMOS transistors and a third NMOS transistor array composed of a plurality of parallel NMOS transistors, wherein the fourth inverter comprises a fourth PMOS transistor array composed of a plurality of parallel PMOS transistors and a fourth NMOS transistor array composed of a plurality of parallel NMOS transistors;
 wherein the second duty cycle ratio control unit outputs a third duty cycle ratio control signal to an input terminal of the third inverter;
 wherein the third inverter adjusts a number of the plurality of PMOS transistors in the third PMOS transistor array to be turned on and the number of the plurality of NMOS transistors in the third NMOS transistor array to be turned on according to the third duty cycle control signal and the negative data input signal, and outputs a third inverter output signal; and
 wherein the fourth inverter receives the third inverter output signal, so that the second duty cycle ratio of the second output signal is smaller than the preset duty cycle ratio by the set value.

17. The memory device according to claim 16, wherein the third inverter increases or decreases the number of the plurality of PMOS transistors that are turned on in the third PMOS transistor array, and decreases or increases the number of the plurality of NMOS transistors that are turned on in the third NMOS transistor array, according to the third duty cycle control signal and the negative data input signal, so that the second duty cycle ratio of the second output signal is smaller than the preset duty cycle by the set value.

* * * * *